US008567339B2

(12) United States Patent
Higashijima et al.

(10) Patent No.: US 8,567,339 B2
(45) Date of Patent: Oct. 29, 2013

(54) LIQUID PROCESSING APPARATUS

(75) Inventors: Jiro Higashijima, Kumamoto (JP); Hiromitsu Namba, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 637 days.

(21) Appl. No.: 12/818,505

(22) Filed: Jun. 18, 2010

(65) Prior Publication Data

US 2010/0319615 A1 Dec. 23, 2010

(30) Foreign Application Priority Data

Jun. 23, 2009 (JP) .................................. 2009-149038
Apr. 1, 2010 (JP) .................................. 2010-085233

(51) Int. Cl.
*B05C 5/02* (2006.01)

(52) U.S. Cl.
USPC ............... 118/52; 118/56; 118/320; 118/715; 118/728; 156/345.1; 134/902

(58) Field of Classification Search
USPC ...................... 118/52, 56, 319, 320, 715, 728; 134/902; 427/240; 156/345.1
See application file for complete search history.

(56) References Cited

U.S. PATENT DOCUMENTS

| 5,454,871 A | * | 10/1995 | Liaw et al. ..................... 118/300 |
| 2002/0139401 A1 | * | 10/2002 | Reynolds ..................... 134/95.3 |
| 2004/0226655 A1 | * | 11/2004 | Kajino et al. ............. 156/345.11 |

FOREIGN PATENT DOCUMENTS

JP 3-30426 A 8/1991

* cited by examiner

*Primary Examiner* — Laura Edwards
(74) *Attorney, Agent, or Firm* — Abelman, Frayne & Schwab

(57) ABSTRACT

There is provided a liquid processing apparatus capable of preventing an atmospheric air of a lower surface side of a substrate, to which a processing liquid is supplied, from circulating and being introduced into an upper surface side of the substrate, to which the processing liquid is not supplied, and capable of decreasing a fuzzy gas consumption supplied to separate the atmospheres between the lower and upper surface sides from each other. An upper plate 5 is disposed at an opposite side to the upper surface of the substrate maintained horizontally and a gas supplier 53, 531 supplies a pressurized gas into a space formed between the upper plate and the substrate. Also, due to a negative pressure built in a space formed between the upper plate and the substrate, an atmospheric gas outside the space is introduced into the space via a gas inlet port.

13 Claims, 12 Drawing Sheets

Exemplary Embodiment 1

Comparative Embodiment 1

Comparative Embodiment 2

LIQUID PROCESSING APPARATUS

This application is based on and claims priority from Japanese Patent Application No. 2009-149038, filed on Jun. 23, 2009, and Japanese Patent Application No. 2010-085233, filed on Apr. 1, 2010, with the Japanese Patent Office, the disclosure of which is incorporated herein in its entirety by reference.

TECHNICAL FIELD

The present disclosure relates to a liquid processing apparatus that processes a substrate by supplying a processing liquid into a lower surface thereof.

BACKGROUND

A thermal processing system, for example, of hot wall type, may employ a film forming process such as CVD (Chemical Vapor Deposition) method, in which a plurality of wafers held on a wafer boat as substrates, are carried into a reaction tube, and a processing gas is supplied under a reduced pressure. Films are then formed on the wafers by heating the wafers or the processing gas by means of a heater placed at the circumference of the reaction tube.

The wafers carried into the reaction tube are maintained in parallel on the wafer boat to have a gap between each other. Thus, films may be formed by the processing gas not only on the front surfaces of the wafers on which semiconductor devices are formed, but also on the back surfaces of the wafers. The films formed on the back surfaces of the wafers need to be removed because they may cause a deformation of the wafers in a thermal processing.

There has been a conventionally known method that removes particles adhered to a back surface of a wafer, by supplying an organic solvent to the back surface of the wafer rotating about its vertical axis, while the wafer is gripped at the peripheral end and held substantially horizontally to expose its back surface. See, for example, page 2, right column, line 4 from the bottom to page 3, left column, line 15, and FIGS. 1 and 2, of Japanese Patent Laid-Open Publication No. HEI 03-030426. In the following description, a front surface and a back surface of a wafer will be referred to as an upper surface and a lower surface of the wafer, respectively.

In the conventional method as mentioned above, upon supplying a chemical liquid to the lower surface of the wafer, the chemical liquid may spread throughout the lower surface of the wafer due to the centrifugal force resulting from the rotation of the wafer. Then, the chemical liquid is dispersed from the periphery of the wafer after it reaches the distal end of the wafer, and discharged out. However, there is concern that some of the chemical liquid, dispersed away from the periphery of the wafer, may be vaporized to be gas or mist, which rises up and circulates to turn back and adhere to the upper surface of the wafer. As a result, there is a problem that the film formed on the upper surface of the wafer may be partially etched out to damage the semiconductor device thereon.

SUMMARY

According to an exemplary embodiment, there is provided a liquid processing apparatus comprising a substrate holder configured to rotate a substrate while the substrate is maintained horizontally, a processing liquid supplier configured to supply a processing liquid to a lower surface of the substrate while the substrate is in rotation, a surrounding member configured to receive the processing liquid dispersed from the substrate where the surrounding member surrounds the substrate held on the substrate holder and includes an absorbing discharge port, an upper plate configured to oppose an upper surface of the substrate held on the substrate holder, a gas supplier positioned at an opposite side of a central portion of the substrate to supply a pressurized gas to a space formed between the substrate and the upper plate, and a gas inlet port configured to introduce an atmospheric gas from outside the space into inside the space by a negative pressure formed at the space between the substrate and the upper plate according to a gas flow from the gas supplier.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
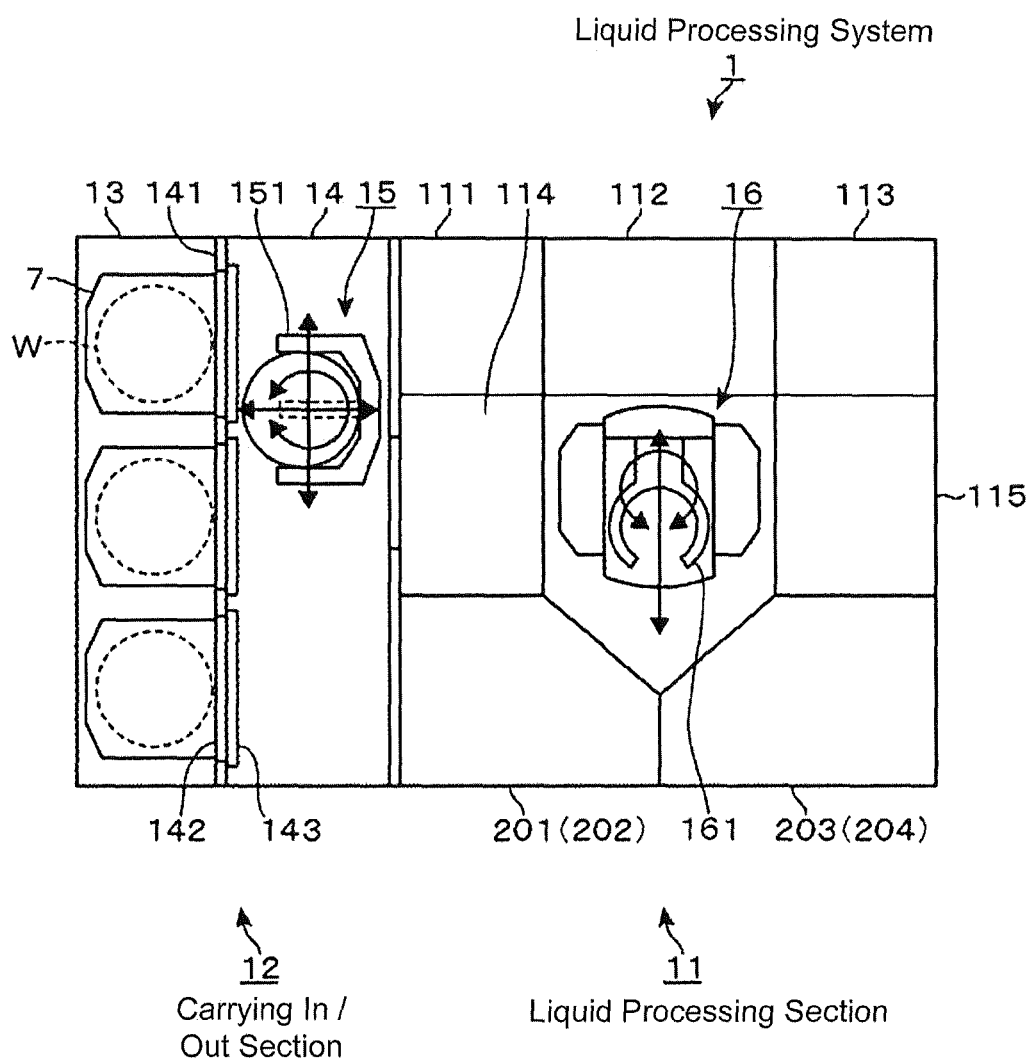
FIG. 1 is a top plan view illustrating the configuration of a liquid processing system including a liquid processing apparatus according to an exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a liquid processing apparatus capable of preventing an atmospheric air of a lower surface side of a substrate, to which a processing liquid is supplied, from circulating and being introduced into an upper surface side of the substrate, to which the processing liquid is not supplied, and capable of decreasing a fuzzy gas consumption supplied to separate the atmospheres at the lower and upper surface sides from each other.

According to an exemplary embodiment, there is provided a liquid processing apparatus comprising a substrate holder configured to rotate a substrate while the substrate is maintained horizontally, a processing liquid supplier configured to supply a processing liquid to a lower surface of the substrate while the substrate is in rotation, a surrounding member configured to receive the processing liquid dispersed from the substrate where the surrounding member surrounds the substrate held on the substrate holder and includes an absorbing discharge port, an upper plate configured to oppose an upper surface of the substrate held on the substrate holder, a gas supplier positioned at an opposite side of a central portion of the substrate to supply a pressurized gas to a space formed between the substrate and the upper plate, and a gas inlet port configured to introduce an atmospheric gas from outside the space into inside the space by a negative pressure formed at the space between the substrate and the upper plate according to a gas flow from the gas supplier.

The liquid processing apparatus according to the exemplary embodiment may further comprise the following features.

(a) The gas inlet port may be open toward the upper plate. In this case, a down flow of a clean air may be formed on an upper surface side of the upper plate.
(b) A gas inlet tube may be connected to the upper plate, and the gas inlet port may be open toward the gas inlet tube. In this case, a space into which a clean air is supplied may be provided, and the gas inlet tube may extend to open the gas inlet port toward the inside of the space into which the clean air is supplied.
(c) A gap forming member may be provided, which is provided at the periphery of the upper plate and forms a gap between the periphery of the upper plate and the peripheral edge of the upper surface of the substrate, where the gap being narrower than the space of the central portion side.
(d) The substrate holder may include a guide plate positioned at an opposite side of the lower surface of the substrate and configured to spread the processing liquid supplied from the processing liquid supplier throughout the lower surface of the substrate.
(e) The inside of the surrounding member may be maintained at a negative pressure with respect to the atmosphere of the upper surface side of the upper plate by an absorption discharge from the absorbing discharge port, and a gap may be formed between the surrounding member and the gap forming member to introduce an atmospheric gas of the atmosphere of the upper surface side of the upper plate into the surrounding member side.
(f) The processing liquid may be HF solution to remove the film formed on the lower surface of the substrate.

According to the present disclosure, the upper plate is opposite to the upper surface of the substrate held on the substrate holder, and the gas inlet port is formed to introduce the gas of the outside atmosphere into the space between the substrate and the upper plate. Thus, upon supplying the gas through a central area of the space between the substrate and the upper plate while the substrate is in rotation, the inside of the space between the substrate and the upper plate becomes a negative pressure due to the Bernoulli effect caused by the wafer rotation or the gas flow, whereby the gas of the outside atmosphere can be introduced. As a result, even if the amount of the supplied gas is reduced compared to the case where the gas inlet port is not provided, the circulation and introduction of the gas or mist of the processing liquid into the lower surface side of the substrate can be prevented.

An Exemplary Embodiment

Figure 2:
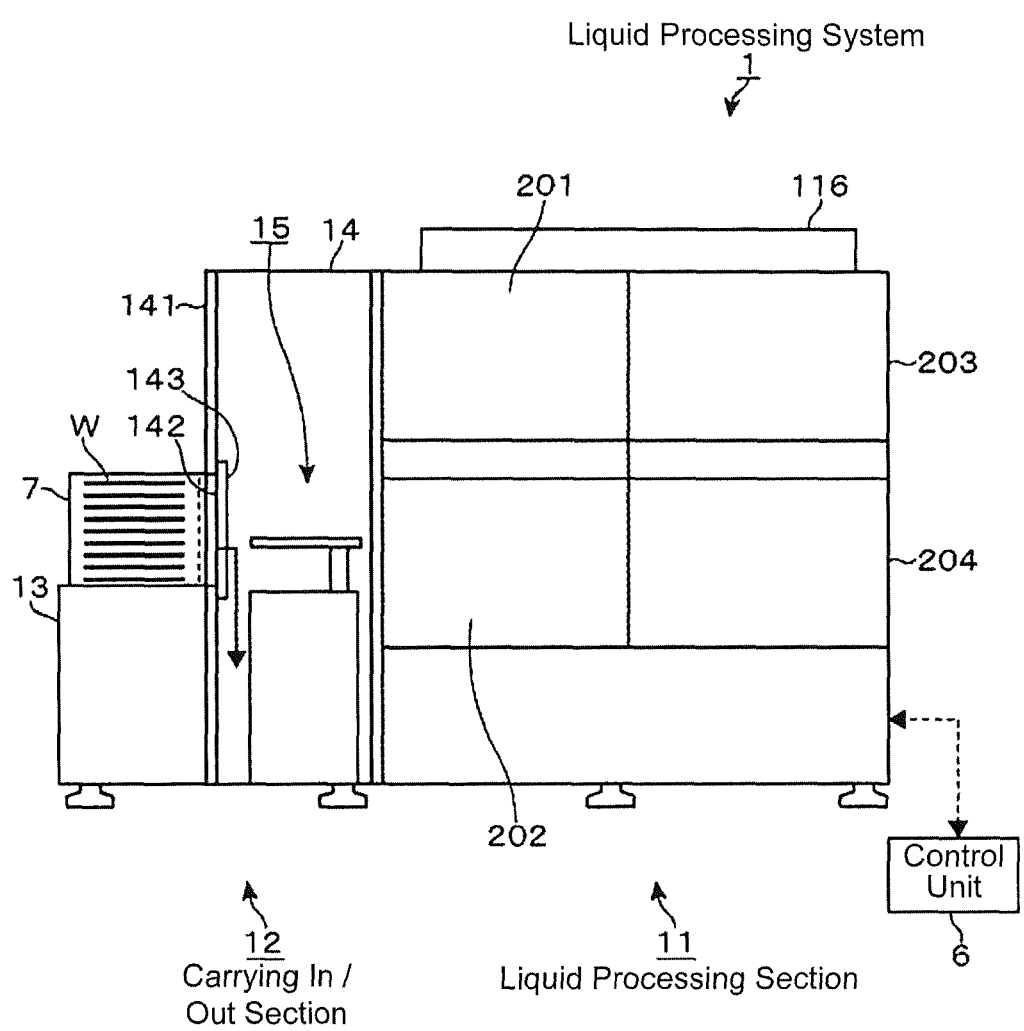
FIG. 2 is a lateral cross-sectional view of the liquid processing system.

Hereinafter, a liquid processing apparatus will be described as an exemplary embodiment according to the present disclosure. By using the HF solution, the liquid processing apparatus conducts a liquid processing that removes an unnecessary film such as a SiN film adhered to a lower surface side of a wafer used as a substrate on which a semiconductor device is formed on an upper surface side. FIG. 1 is a top plan view illustrating an entire configuration of a liquid processing system 1 including a liquid processing apparatus according to the exemplary embodiment of the present disclosure, and FIG. 2 is a lateral cross-sectional view thereof. Liquid processing system 1 includes a liquid processing section 11 to conduct a liquid processing that removes a SiN film from a lower surface of a wafer W, and a carrying in/out section 12 to carry wafer W between liquid processing section 11 and outside. Hereinafter, the side at which carrying in/out section 12 is provided will be referred to as a front side, and the side at which liquid processing section 11 is provided will be referred to as a back side.

In carrying in/out section 12, there are provided a loader 13 to dispose a FOUP (Front Opening unified Pod) 7 accommodating a plurality of wafers W, for example, 25 wafers, and a carrying chamber 14 that is a space to deliver wafer W between liquid processing section 11 and FOUP 7 disposed on loader 13. FOUP 7 accommodates a plurality of wafers W maintained substantially horizontally and arranged with a predetermined gap between each other in a vertical direction.

Loader 13 is configured to be able to dispose, for example, 3 FOUPs 7 at predetermined locations along a side wall potion 141 provided at the front side of a case forming a housing of liquid processing system 1. On side wall portion 141 adjacent to loader 13, openings 142 are provided at locations corresponding to the locations of FOUPs 7. These openings 142 can be open and closed by a shutter 143. FOUP 7 is disposed on loader 13 and its cover, capable of being open and closed, is provided at a lateral side to be opposite to openings 142. Wafer W is carried in or out upon separating the cover, for example, by means of an opening and closing mechanism (not shown) provided at shutter 143.

A first wafer carrying mechanism 15 is provided inside carrying chamber 14 to carry wafer W between liquid processing section 11 and FOUP 7 on loader 13. First wafer carrying mechanism 15 includes a pick 151 capable of moving forward and backward, upward and downward, and rotating. Wafer W is held on pick 151 and carried. Further, first wafer carrying mechanism 15 is configured to be able to move left and right directions, when seen from the front side, within a space of carrying chamber 14, and guides pick 15 into any vertical location in each FOUP 7 on loader 13. Moreover, it can guide pick 15 into a wafer conveying unit 114 provided in liquid processing section 11, which will be described below, to carry or convey wafer W.

Liquid processing section 11 includes a wafer conveying unit 114 to temporarily load wafer W carried from or to carrying chamber 14, liquid processing units 201~204, for example, 4 units, each accommodating a liquid processing apparatus to conduct a liquid processing of wafer W, a heating/cooling unit 115 to control a temperature of wafer W after liquid processing, and a second wafer carrying mechanism 16 to carry wafer W between the units 114, 115, 201~204.

Besides, there are provided in liquid processing section 11, a chemical liquid storing unit 111 to store chemical liquid to be supplied to liquid processing units 201~204, a power unit 112 to supply electric power throughout liquid processing system 1, and a system control unit 113 to control the operation of liquid processing system 1 and each units therein. Also, as shown in FIG. 2, a ceiling portion of liquid processing section 11 includes a pan filter unit FFU 16 to form a down flow of a clean air in a space provided with each unit 114, 115, 201~204 or second wafer carrying mechanism 16.

Next, a configuration of liquid processing apparatus 2 provided in each liquid processing unit 201~204 will be described with reference to FIG. 3 and FIG. 4. As shown in the lateral cross-sectional view of FIG. 3, liquid processing apparatus 2 is configured to dispose a cup body 4 within a case 21. Cup body 4 is provided to surround a wafer holding mechanism 3, which may be one type of a substrate holder to hold wafer W rotatably, and wafer W held on wafer holding mechanism 3, and functions as a surrounding member to receive a chemical liquid dispersed from wafer W.

At the ceiling portion of case 21, there is provided a gas flow introducing part 24 that is a space into which a gas flow is introduced from FFU 116 provided in liquid processing section 11, as mentioned above, of liquid processing system 1. By guiding an air introduced into gas flow introducing part 24 to the inside of case 21 through a plurality of vent holes 211 provided at a ceiling surface of case 21, a down flow of a clean air flowing from an upper side toward a lower side in case 21, can be formed. In case 21, the portion depicted by reference numeral 23 is a carrying in/out port to carry in or out wafer W disposed on pick 161 of second wafer carrying mechanism 16, the portion depicted by reference numeral 22 is a shutter to open or close carrying in/out port 23, and the portion depicted by reference numeral 212 is a discharge port to discharge atmosphere of case 21 to outside.

A wafer holding mechanism 3 includes a guide plate 31 which is provided at the lower surface side of wafer W maintained substantially horizontally and at an opposite side to wafer W, a rotation axis 32 of a cylindrical shape which supports the central portion of guide plate 31 on the lower surface side and extends vertically downwardly, and a lifter 34 having a top portion capable of projecting and retracting from an opening in the central portion of guide plate 31 and being inserted within and passing through rotation axis 32 in an upward and downward direction.

Guide plate 31 is a disc shaped member with the upper surface of the peripheral edge being rounded to form a curved surface by chamfering. A groove portion 311 is formed on the lower surface side of the peripheral edge along a circumferential direction. As shown in FIG. 3 and FIG. 4, supporting pins 312, for example, 3 pins, to support wafer W almost horizontally, are provided on the upper surface side of guide plate 31 with a uniform interval along a circumferential direction, specifically, in an area closer to the center of guide plate 31 than to the peripheral edge having the curved surface. Each supporting pin 312 includes a recess 313 to support the periphery of wafer W on its lower surface side.

Rotation axis 32 supporting guide plate 31 on the lower surface side of guide plate 31 is supported by an axis support 33 having bearings or the like therein on bottom surfaces of cup body 4 and case 21. A bottom end of rotation axis 32 protrudes downwardly from the bottom surface of case 21 and the bottom end has a pulley 364. In a lateral side of rotation axis 32, a rotating motor 361 is provided. The rotation axis of rotating motor 361 also has a pulley 362. A rotating device for rotation axis 32 is formed by winding a driving belt 363 on two pulleys 362, 364. By driving rotating motor 361, rotation axis 32 rotates with a desired rotation speed, whereby guide plate 31 and wafer W held on guide plate 31 can be rotated.

Also, an opening 341 widening in a bowl shape is provided at a top portion of lifter 34 inserted into rotation axis 32. As shown in FIG. 3, at a inclined surface of opening 341, there is provided supporting pins 342, for example, 3 pins, which support wafer W on the lower surface side as lifter 34 protrudes from the upper surface of guide plate 31. To a bottom portion of lifter 34, a cylinder motor 351 is connected through an elevating plate 352. By driving cylinder motor 351, elevating plate 352 and lifter 34 moves in an upward and downward direction, and lifter 34 protrudes or retracts from the upper surface of guide plate 31, whereby wafer W is conveyed between supporting pins 342 and pick 161 guided onto lifer 34.

Also, a liquid channel 343 passing through lifter 34 in an upward and downward direction is formed inside lifter 34. Liquid channel 343 functions to supply processing liquid such as HF solution, deionized water DIW, and isopropyl alcohol IPA, supplied from a HF solution storage (not shown), to the lower surface of wafer W through opening 341 provided at the top portion of lifer 34. Thus, lifter 34 according to the present embodiment may be one type of the processing liquid supplier according to the present disclosure, which supplies HF solution as a processing liquid to a lower surface of wafer W.

Figure 3:
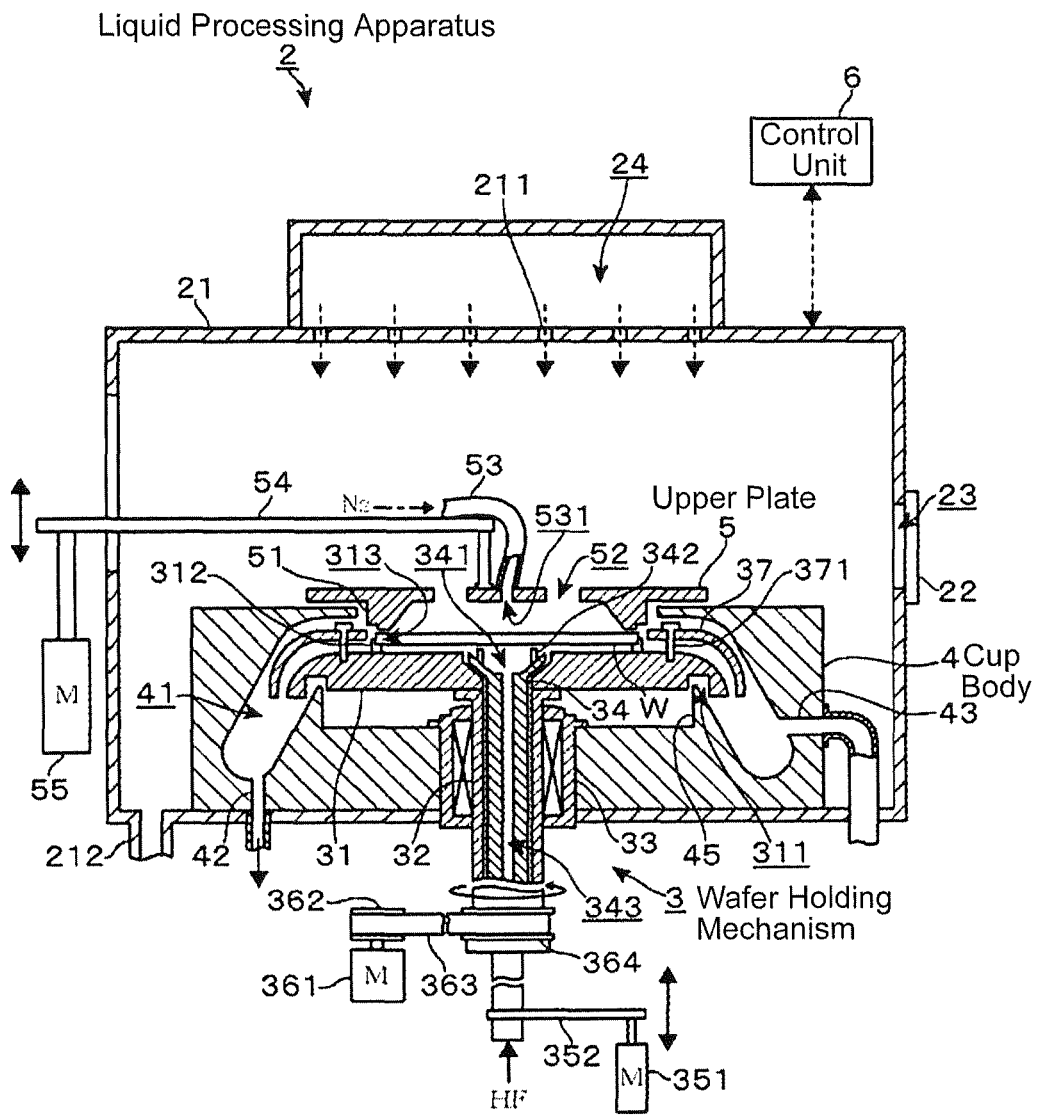
FIG. 3 is a lateral cross-sectional view illustrating the configuration of the liquid processing apparatus provided within the liquid processing system.
Figure 4:
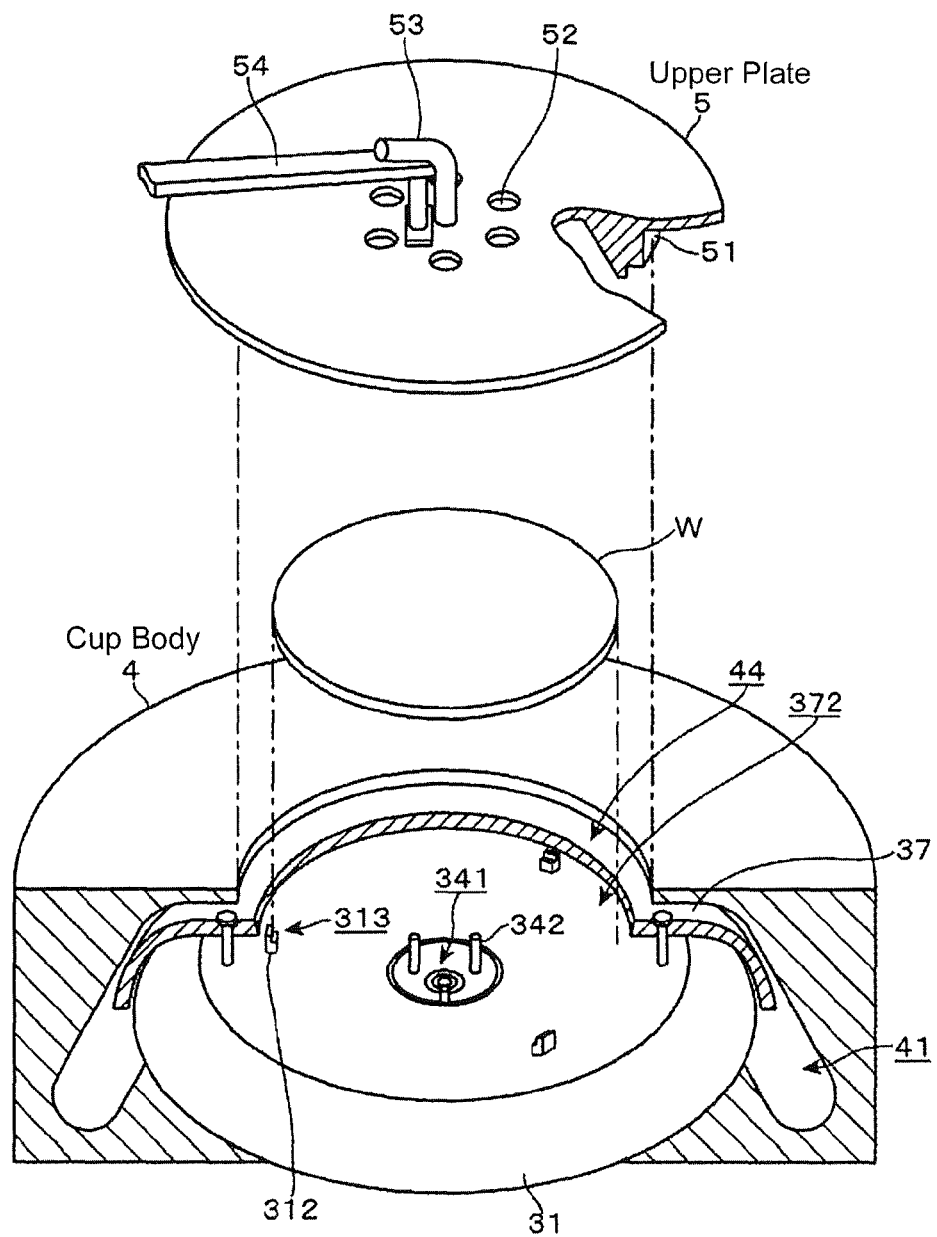
FIG. 4 is a perspective view illustrating an internal configuration of the liquid processing apparatus.

Also, as shown in FIG. 3 and FIG. 4, a guide plate 37 is disposed over the peripheral edge of the curved surface of guide plate 31 mentioned above. Guide plate 37 is a ring-shaped plate member. On a lower surface of guide plate 37, a concave curved surface opposite to the (convex) curved surface of guide plate 31 is formed, and in a central area of guide plate 37, an opening 372 with a diameter longer than that of wafer W is formed. As shown in FIG. 3, wafer W placed on supporting pins 312 of guide plate 31 is disposed inside opening 372 of guide plate 37.

Guide plate 37 is fixed over guide plate 31 by means of fixing pins 371 to form a gap between the curved surface of the upper surface of guide plate 31 and the curved surface of the lower surface of guide plate 37. HF solution supplied from opening 341 of lifter 34 spreads through the gap between the lower surface of wafer W and the upper surface of guide plate 31, and then flows into the gap between guide plate 31 and guide plate 37 to be guided to cup body 4.

Cup body 4, for example, as shown in FIG. 4, is a flat cylindrical member, in which there are formed a recessed portion that opens at a central area of the upper surface of the member [hereinafter, the opened part of the recessed portion will be referred to as an opening 44], and a liquid receiving space 41 that surrounds the recessed portion, gradually extends outwards from a top portion of the recessed portion toward a bottom portion of the peripheral edge of the cylindrical member, and has an inner peripheral surface of U shape in a lateral cross-sectional view.

As mentioned above, each of guide plate 31 and guide plate 37 is supported on rotation axis 32 penetrating a bottom surface of cup body 4 and received within the recessed portion of cup body 4. Peripheral edges of guide plate 31 and guide plate 37 extend into the upper space of liquid receiving space 41. Further, on the inner surface of the upper side of liquid receiving space 41, a concave curved surface opposite to a (convex) curve surface in the upper surface of guide plate 37 is formed. When guide plate 37 is disposed within cup body 4, a gap is formed between the upper surface of guide plate 37 and the inner surface of liquid receiving space 41 to allow fuzzy gas or the like, which will be described blow, to flow therethrough. Also, in FIG. 3, reference numeral 45 depicts a projecting portion, which extends into groove portion 311 formed on the lower surface of guide plate 31 to form a narrow space, thereby preventing gas flowing inside liquid receiving space 41 from being introduced toward rotation axis 32.

At the bottom portion of liquid receiving space 41, a liquid discharge port 42 configured to discharge HF solution collected in liquid receiving space 41 is provided. Also, for example, at a side wall surface of liquid receiving space 41, an absorbing discharge port 43 configured to discharge gas introduced into liquid receiving space 41 is provided. Absorbing discharge port 43 is connected to a compressor (not shown) that discharges gas in liquid receiving space 41 by absorption, whereby the inside of liquid receiving space 41 can be maintained with a negative pressure lower than the pressure of case 21 outside cup body 4.

Besides the components mentioned above, liquid processing apparatus 2 includes an upper plate 5, for example, of a disc shape, which is configured to close opening 44 of cup body 4 and to form a plate space between the upper plate 5 and wafer W held on guide plate 31. An upper surface of upper plate 5, for example, is cantilevered by a supporting beam 54, and supporting beam 54 is connected to cylinder motor 55. Upper plate 5 is configured such that, by driving cylinder motor 55, upper plate 5 can move between a processing position in which upper plate 5 is opposite to the upper surface of wafer W placed within cup body 4, and a retreated position in which upper plate 5 is retreated upwards from the processing position.

Also, in a central portion of upper plate 5, there is provided a fuzzy gas supply port 531 configured to supply an inert gas as a fuzzy gas such as, for example, nitrogen gas $N_2$ into the space formed between wafer W and upper plate 5. A fuzzy gas supply tube 53 connected to a fuzzy gas source (not shown) is connected to fuzzy gas supply port 531. Fuzzy gas supply port 531 and fuzzy gas supply tube 53 may correspond to the gas supplier of liquid processing apparatus according to the present disclosure.

On the lower surface of upper plate 5, there is formed a protruding portion 51 of a ring shape, which is configured to fit into opening 44 of cup body 4 and protrudes downward from upper plate 5. Protruding portion 51 has, for example, 2 stepped portions, which extend downwards from an outer periphery side toward an inner periphery side. The lowest surface of the stepped portions is opposite to the upper surface of the outer peripheral edge of wafer W so as to form a small gap which is narrower than a space of the central area. In the present embodiment, the gap formed between the lowest surface of protruding portion 51 and the outer peripheral edge of wafer W, is formed, for example, in the range of 0.5 mm to 2.0 mm.

Protruding portion 51 also has an inclined surface of a taper type, which is formed on the inner periphery than the area including the stepped portions, and extends upwards from the outer peripheral side toward the inner peripheral side. Thus, protruding portion 51 can guide gas supplied into the space formed between wafer W and upper plate 5 toward the gap. As such, protruding portion 51 plays a role of a gap forming member in view of the function of forming a small gap with wafer W and of discharging gas in the space of the central area toward liquid receiving space 41. Protruding portion 51 also plays a role of a partitioning member, which separates the atmosphere of liquid receiving space 41 from that of the space formed between wafer W and upper plate 5 so as to prevent a reverse flow of HF gas or mist from liquid receiving space 41.

Here, in a state where upper plate 5 is descended to the processing position, a gap is formed between the inner peripheral edge of opening 44 and the outer peripheral surface of protruding portion 51 fit into opening 44, and between the upper surface of cup body 4 and the lower surface of upper plate 5, extending to liquid receiving space 41. Thus, a gas flow of introducing the atmosphere of case 21, i.e., the atmospheric gas in the upper surface side of upper plate 5, into liquid receiving space 41, can be made.

Also, upper plate 5 has a gas inlet port 52 configured to reduce a required amount of fuzzy gas. According to the present embodiment, gas inlet port 52 is an opening, for example, of a circular type, which penetrates the upper and the lower surfaces of upper plate 5. A plurality of gas inlet ports 52, for example, 6 ports, are provided at an area closer to a central portion as compared to the small gap formed between protruding portion 51 and wafer W, and surrounds fuzzy gas supply port 531. As a result, as it will be explained in the following description, the atmospheric gas at the upper surface side of upper plate 5 is introduced to the space formed between wafer W and upper plate 5 through gas inlet port 52 as a negative pressure occurs in the space.

Also, as shown in FIG. 2 and FIG. 3, a control unit 6 is connected to liquid processing system 1 including liquid processing apparatus 2. Control unit 6 comprises, for example, a computer having a CPU and a memory (not shown). The memory has a program recorded therein, in which a group of control steps (commands) related to the operations of liquid processing system 1 or liquid processing apparatus, for example, carrying wafer W into each liquid processing apparatus 2, removing SiN film on the lower surface of wafer W through a liquid processing by means of liquid processing apparatus 2, and conveying wafer W outside, are structured. The program is stored in a recording medium such as, for example, a hard disc, a compact disc, a magneto-optical disc, a memory card, etc., and is installed from the recording medium to the computer. Control unit 6 is provided, for example, in a machine control unit 113 of liquid processing system 1.

Next, an operation of liquid processing system according to the exemplary embodiment of the present disclosure will be explained in the following description. When a process by liquid processing system 1 starts, first wafer carrying mechanism 15 unloads wafer W from FOUP 7 placed on loader 13, and sequentially disposes wafers W on wafer conveying unit 114 in liquid processing section 11. Second wafer carrying mechanism 16 receives wafer W to be processed from wafer conveying unit 114, and carries wafer W into liquid processing unit 201~204.

Figure 5:
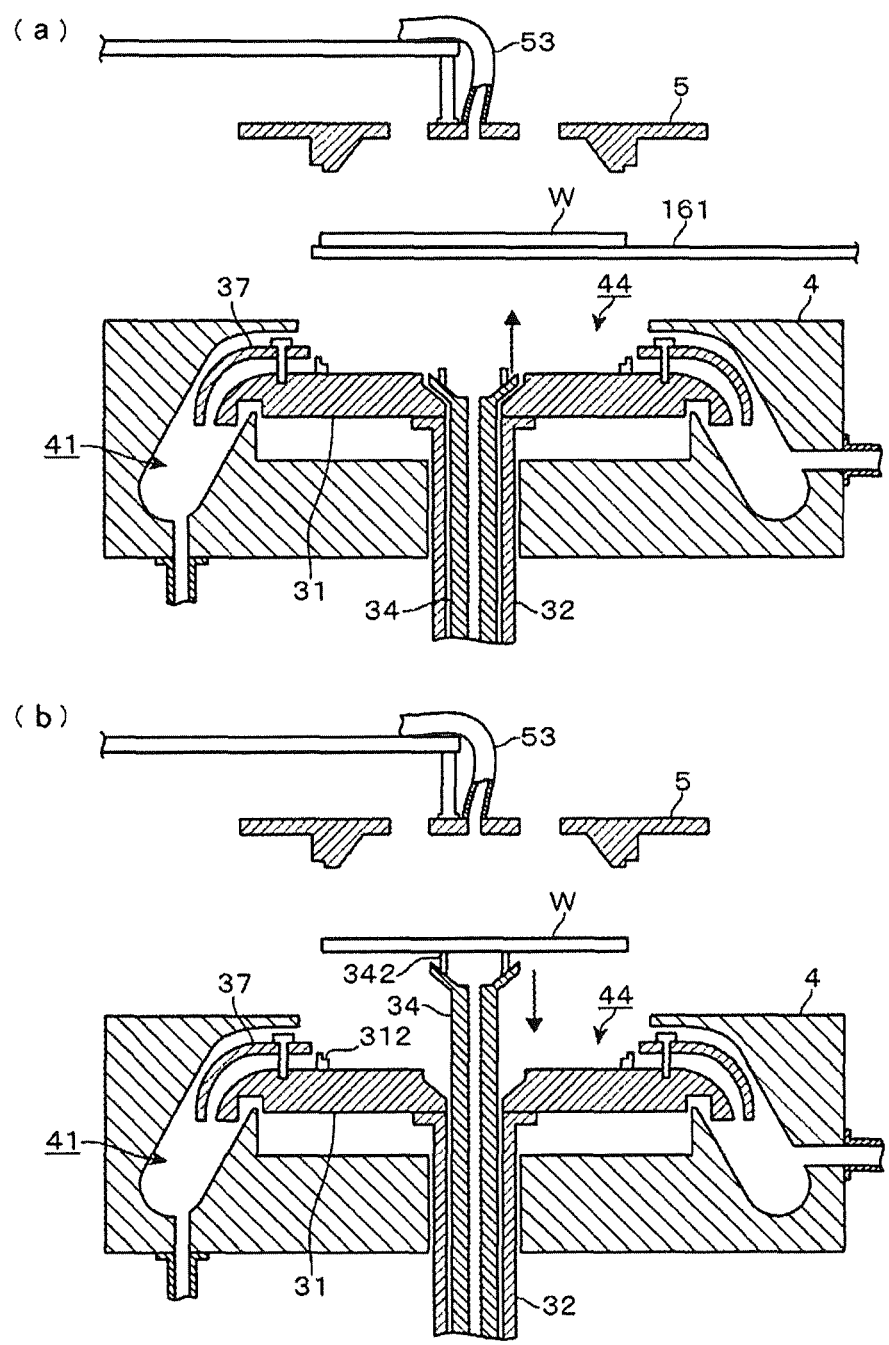
FIG. 5 is a first lateral cross-sectional view illustrating an operation of the liquid processing apparatus.

In liquid processing unit 201~204, as sown in FIG. 5 (*a*), after upper plate 5 retreats to the retreated position and shutter 22 of case 21 opens, pick 161 with wafer W held thereon moves into a location between upper plate 5 at the retreated position and opening 44 of cup body 4. As shown in FIG. 5 (*b*), with lifter 34 elevated to cross pick 161, wafer W is carried onto supporting pins 342 of lifter 34. Then, pick 161 moves out from case 21 and shutter 22 closes.

Figure 6:
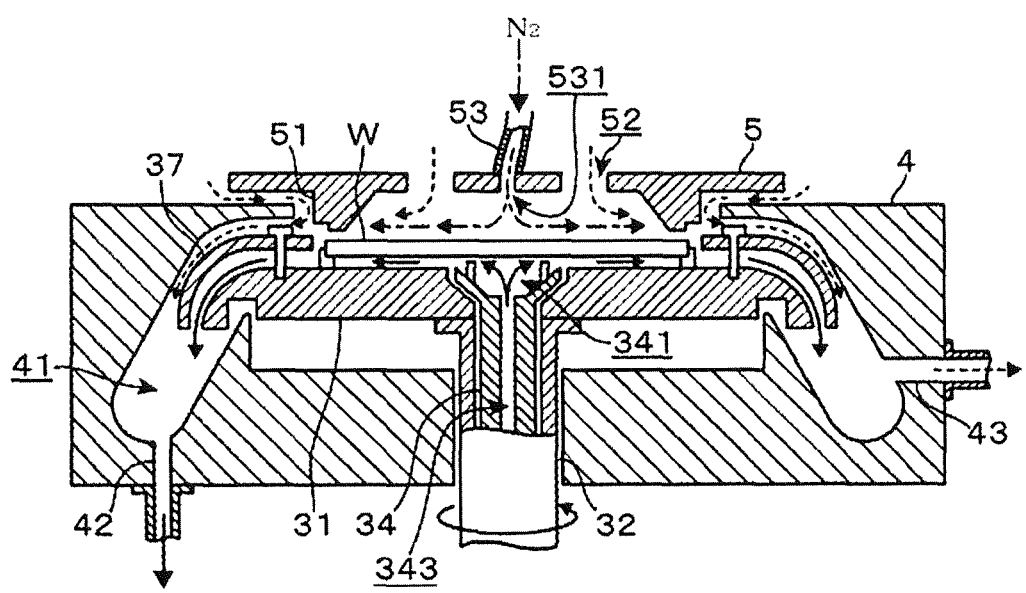
FIG. 6 is a second lateral cross-sectional view illustrating an operation of the liquid processing apparatus.

Continuously, wafer W is held on supporting pins 312 as lifter 34 retracts into rotation axis 32, and upper plate 5 descends to the processing position thereby completing a preparation for entering a liquid processing process. At this time, a down flow of a clean air is continuously being made in case 21. In FIG. 5 (*a*), FIG. 5 (*b*) and FIG. 6, axis support (33) is not shown.

Upon completing the operations mentioned above, as shown in FIG. 6, rotation axis 32 rotates, for example, at a rotating speed of hundreds of rpm, and supply of HF solution from liquid channel 343 begins. Due to a centrifugal force caused by the rotation of guide plate 31, HF solution discharged from opening 341 flows from the central area toward the peripheral edge in the space formed between wafer W and guide plate 31, and spreads throughout the entire lower surface of wafer W. As a result, HF solution contacts the lower surface of wafer W and melts a SiN film thereby removing the unnecessary film. Further, as HF solution flows from the central area toward the peripheral edge in the space formed between wafer W and guide plate 31, wafer W is fixed due to the action of Bernoulli Effect pulling wafer W toward guide plate 31. Then, HF solution is dispersed from the lower surface of wafer W, passing through the gap formed between guide plate 31 and guide plate 37, and drops into liquid receiving space 41. As such, in the present embodiment, wafer W is fixed by using a manner of a Bernoulli chuck. However, needless to say, wafer W may be fixed by a mechanical chuck.

Also, at the upper surface side of wafer W, a pressurized fuzzy gas is supplied from gas supply tube 53 into the space formed between wafer W and guide plate 5, and flows from the central area side toward the peripheral edge side of wafer W. Further, a centrifugal force occurred from the rotation of wafer W held on guide plate 31 is applied, which also promotes the flow of the fuzzy gas from the central portion toward the peripheral edge portion of wafer W Due to Bernoulli Effect according to the rotation of guide plate 31 or the flow of the fuzzy gas mentioned above, a negative pressure is built in the space formed between guide plate 31 and wafer W, whereby the atmospheric gas (of a clean air) at the upper surface side of upper plate 5 is introduced into the space through gas inlet port 52. By introduction of the clean air from the upper surface side of upper plate 5, it is possible to reduce a required amount of the fuzzy gas supplied from fuzzy gas supply tube 53 as compared to the case where gas inlet port 52 is not provided.

The fuzzy gas and the clean air flow from the central portion side toward the peripheral edge side in the space formed between guide plate 31 and wafer W so as to reach the area where protruding portion 51 is provided, and then flow into liquid receiving space 41 where a negative pressure is maintained by absorbing discharge. Specifically, these gases pass through the small gap formed between wafer W and protruding portion 51, pass through the gap formed between guide plate 37 and liquid receiving space 41, and flow into a bottom area of liquid receiving space 41.

Also, from the gap communicated from between opening 44 and protruding portion 51 to between cup body 5 and upper plate 5, a clean air is introduced from the upper surface side of upper plate 5 toward the inside of liquid receiving space 41 maintained with a negative pressure. The clean air joins a mixed gas of the fuzzy gas and the clean air passed through the gap of the lower portion of protruding portion 51, and then passes through the upper surface side of guide plate 37 so as to flow into the bottom area of liquid receiving space 41.

As such, because the fuzzy gas supplied from fuzzy gas supply port 531, the clean air introduced from gas inlet port 52 and the clean air introduced from the gap between upper plate 5 and cup body 4, are joined together so as to flow through the upper surface side of guide plate 37, the mist of HF solution dispersed from guide plate 31 into liquid receiving space 41 or the HF gas volatilized from HF solution can hardly flow reversely up to the upper surface side of wafer W against the flow of the fuzzy gas. As a result, the problem that the upper surface of wafer W, on which semiconductor devices are formed, is etched out by the mist of HF solution or HF gas, can be prevented.

After the unnecessary SiN film formed on the lower (back) surface of wafer W is removed according to the operations mentioned above, liquid processing apparatus 2 stops supplying of HF solution, and continuously, for example, supplies DIW from liquid channel 343 via opening 341 while wafer W is in rotation so as to rinse the back surface of wafer W. Then, wafer W is subject to a dry spinning thereby completing the liquid processing process.

When the dry spinning of wafer W is completed, rotation axis 32 stops rotating, and supply of the fuzzy gas from fuzzy gas supply port 531 is stopped. Continuously, upper plate 5 is elevated to the retreated position and, in an order reverse to the case of carrying in, wafer W is conveyed from lifer 34 onto pick 161 and is carried out from liquid processing apparatus 2.

Then, wafer W is carried into carrying chamber 14 by means of wafer conveying unit 114, via a route reverse to the case of carrying in, and is received within FOUP 7 completing a series of operations. By continuously practicing the operations mentioned above to a plurality of wafers W, liquid processing system 1 conducts a liquid processing to all wafers W in FOUP 7 placed on loader 13.

Liquid processing apparatus 2 according to the exemplary embodiment of the present disclosure provides the following advantageous results. Because upper plate 5 is provided to be opposed to the upper surface of wafer W held on wafer holding mechanism 3 and, for example, gas inlet port 52 configured to introduce the atmospheric gas at the upper surface side of upper plate 5 is provided in upper plate 5, a negative pressure occurs inside the space formed between upper plate 5 and wafer W upon rotating wafer W, whereby the atmospheric gas at the upper surface side of upper plate 5 [the down flowing clean air generated in case 21 in the present embodiment] can be introduced into the space due to the Bernoulli Effect caused by the rotating of wafer W or the flow of fuzzy gas. As a result, a gas flow from the upper surface side toward the lower surface side of wafer W is formed, which separates the atmosphere of the upper surface side from that of the lower surface side of wafer W. Accordingly, it is possible to prevent a HF gas or a HF mist from circulating and flowing from the lower surface side into the upper surface side of wafer W, thereby suppressing the problem that an unnecessary etching progresses at the upper surface of wafer W on which semiconductor devices are formed.

Further, in liquid processing apparatus 2 according to the present embodiment, in order to more securely separate the atmospheres at the upper surface side from the lower surface side of wafer W, there are provided fuzzy gas supply port 531 and fuzzy gas supply tube 53, which are configured to supply a pressurized fuzzy gas from the central portion of wafer W toward the space formed between upper plate 5 and wafer W. As a result, because a gas and the fuzzy gas join together and flow on the upper surface of wafer W, it is possible to prevent an HF gas or an HF mist from circulating and flowing into the upper surface of wafer W even if the amount of fuzzy gas supplied decreases, as compared, for example, with the case where gas inlet port 52 is not provided.

In the exemplary embodiment explained above, there is described one aspect of liquid processing which removes a SiN film formed on the lower surface side of wafer W by using an HF solution. However, the type of a film to be removed or a processing liquid is not limited to the embodiment described above. It may be possible to remove another film, such as a Cu film, by using another processing liquid, such as a diluted HCL. Also, the type of a liquid processing is not limited to removing a film formed on a lower surface of wafer W, and another type of processing such as, for example, cleaning, may be applicable.

Herein, the total area of gas inlet port 52 may be, for example, in the range of 5% to 50% of the area of upper plate 5 being in an opposite side of wafer W. Also, the shape of gas inlet port 52 may not be limited to the shape shown in FIG. 4, but may be a pan shape or a polygon. The size or the number of gas inlet port 52 may not be limited to the aspect mentioned above, and may be increased or decreased.

Besides, it may be allowable not to provide the cantilevered beam 54 moving upper plate 5 up and down. Instead, upper plate 5 may be configured to be fixed on the upper surface of cup body 4. In this case, for example, carrying in/out port having a shutter may be provided for wafer W on a lateral circumferential surface of cup body 4 so as to convey wafer W by moving pick 161 in therethrough.

Also, regarding the area where a liquid processing is conducted, it is not limited to the case a processing liquid is supplied throughout the entire lower surface of wafer W. For example, it may be allowable to conduct a liquid processing only to the peripheral edge side of the lower surface of wafer W. In this case, it may be configured, for example, to hold a central portion of the lower surface of wafer W on a vacuum chuck instead of guide plate 31, to rotate wafer W while facing a discharge nozzle to a peripheral edge of wafer W, and to supply a processing liquid only to the peripheral edge of the lower surface of wafer W.

Figure 7:
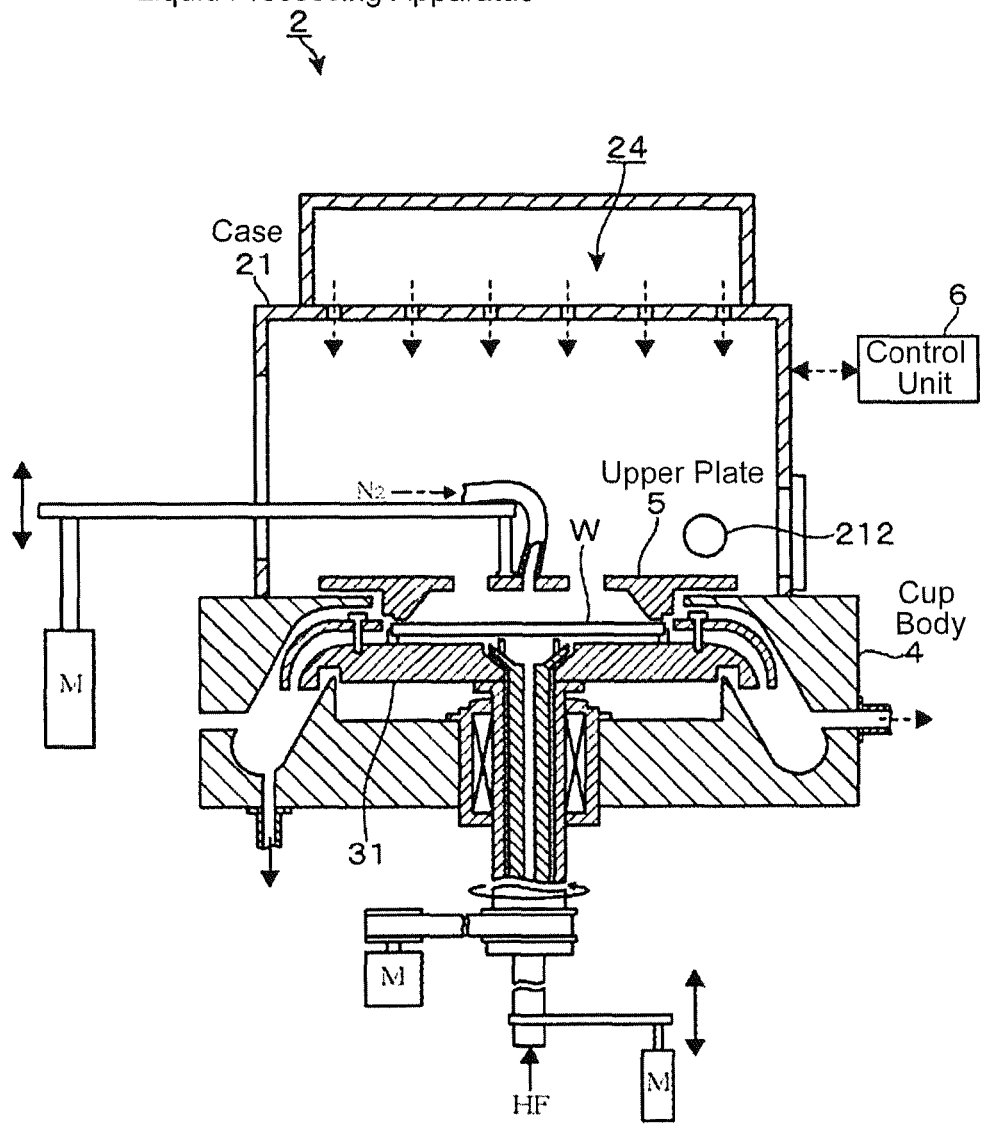
FIG. 7 is a lateral cross-sectional view illustrating a modified embodiment of a case accommodating the liquid processing apparatus.

Herein, while the entire cup body 4 is accommodated within case 21 in FIG. 3, it may be configured to dispose a compact case 21 on a cup body 4 so as to reduce a total size of a liquid processing apparatus 2 as shown in FIG. 7. In this case, for example, a gas discharge port 212 discharging an atmospheric gas in case 21 may be provided on a circumferential side wall surface of case 21.

Figure 8:
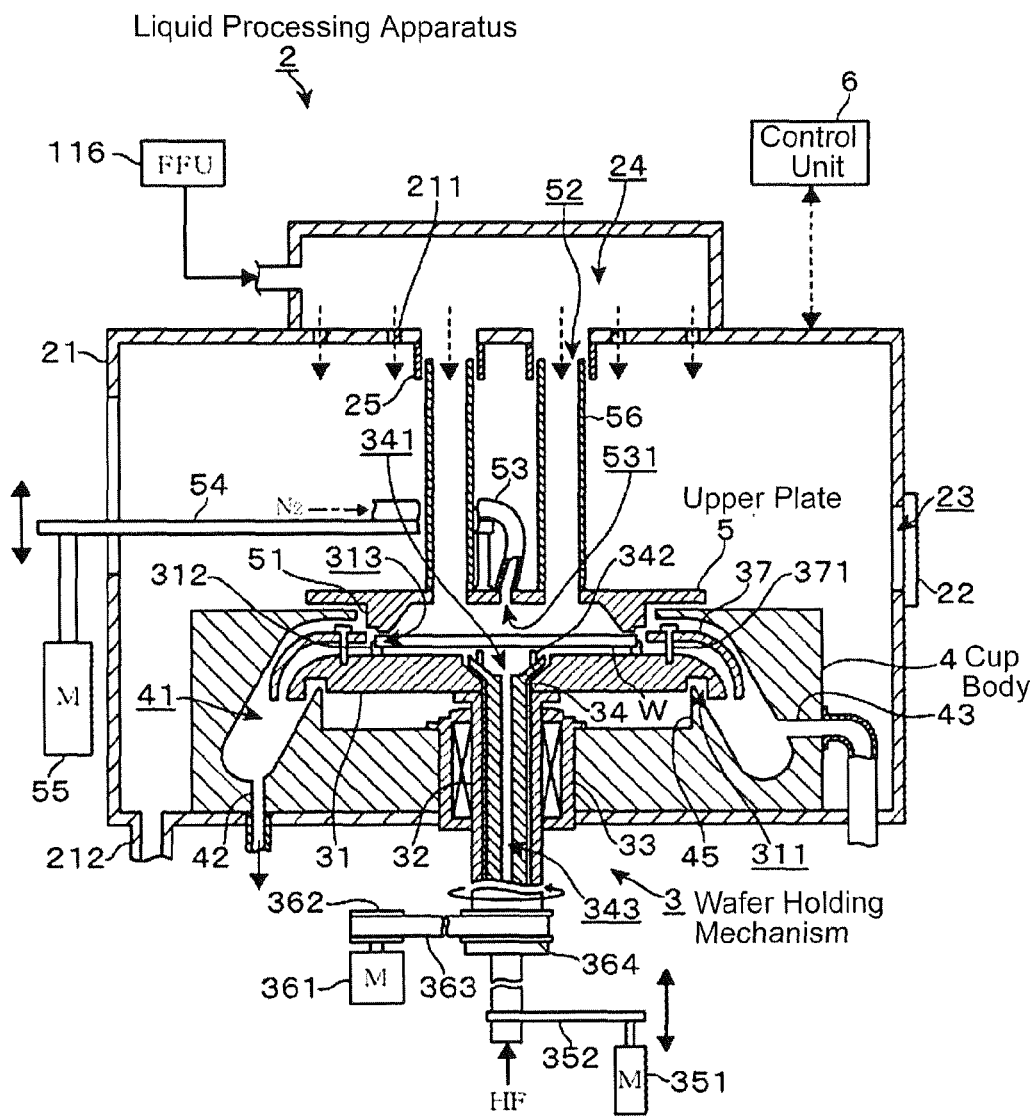
FIG. 8 is a lateral cross-sectional view illustrating an alternative embodiment of the liquid processing apparatus.

Moreover, the configuration of gas inlet port 52 is not limited to be directly opened on the upper surface of upper plate 5, and, as shown in FIG. 8, for example, a gas inlet tube 56 may be connected to an upper plate 5 and a gas inlet port 52 may be provided on gas inlet tube 56 so as to introduce an atmospheric gas from a distance located apart from upper plate 5. As shown in FIG. 8, a gas flow introducing part 24 is a space circumferentially surrounded by a plate member and separated from case 21, and configured to introduce a clean air flow. In this alternative exemplary embodiment, gas inlet tube 56 extends upwards from upper plate 5 in a chimney shape in a space inside case 21, and gas inlet port 52 opens at a top portion of gas inlet tube 56. Also, in gas flow introducing part 24 into which a clean air flow is introduced from FFU 116, there is a sleeve portion 25 of a short tube shape, of which a bottom portion opens toward an inside of case 21, and a top portion of gas inlet tube 56 is inserted into sleeve portion 25.

As a result, gas inlet port 52 opens into the inside of gas flow introducing part 24 so as to introduce a clean air from FFU 116. Accordingly, even if particles are generated due to an opening/closing operation of a shutter 22 provided in a carrying in/out port 23 for wafer W or an ascending/descending operation of upper plate 5, it is possible to decrease such a problem that these particles are introduced via gas inlet port 52 and adhered to a surface of wafer W. Here, when comparing a fuzzy gas from a fuzzy gas supply tube 53 with a down flow of a clean air introduced from gas flow introducing part 24, the fuzzy gas has a higher pressure and a larger flow amount than those of the clean air. Further, in the present exemplary embodiment as shown in FIG. 8, the top portion of gas inlet tube 56 is configured to be able to penetrate into gas flow introducing part 24 through sleeve portion 25, thereby preventing an intervention between gas inlet tube 56 and case 21 when upper plate 5 is elevated.

Herein, the introduction of a gas into gas inlet port 52 is not limited to the case conducted by inserting gas inlet tube 56 into gas flow introducing part 24 through sleeve portion 25. For example, it may be configured to open gas inlet port 52 near a lower side of a vent hole 211 provided on upper plate 5 and to open gas inlet port 52 toward an inside of gas flow introducing part 24. In this case, gas inlet tube 56 may extend to a vicinity area under vent hole 211 to the extent that gas inlet tube 56 and case 21 do not interfere with each other when upper plate 5 moves up and down. Here, the vicinity area under vent hole 211 may be in an upper side of the opening/closing operation range of shutter 22 and in an upper side of the ascending/descending operation of upper plate 5. Also, it may be configured, for example, to bend gas inlet tube 56 to have a U shape in case 21 so as to open gas inlet port 52 toward a direction being opposite to the location where carrying in/out port 23 is provided.

Experimental Embodiments

Upper plate 5 has been disposed on cup body 4, and a liquid processing has been conducted to remove a SiN film on a lower surface of wafer W. Subsequently, an etching amount has been measured at 49 points (indicated as, for example, white dots in FIG. 10) on an upper surface of wafer W.

A. Experimental Conditions

Figure 9:
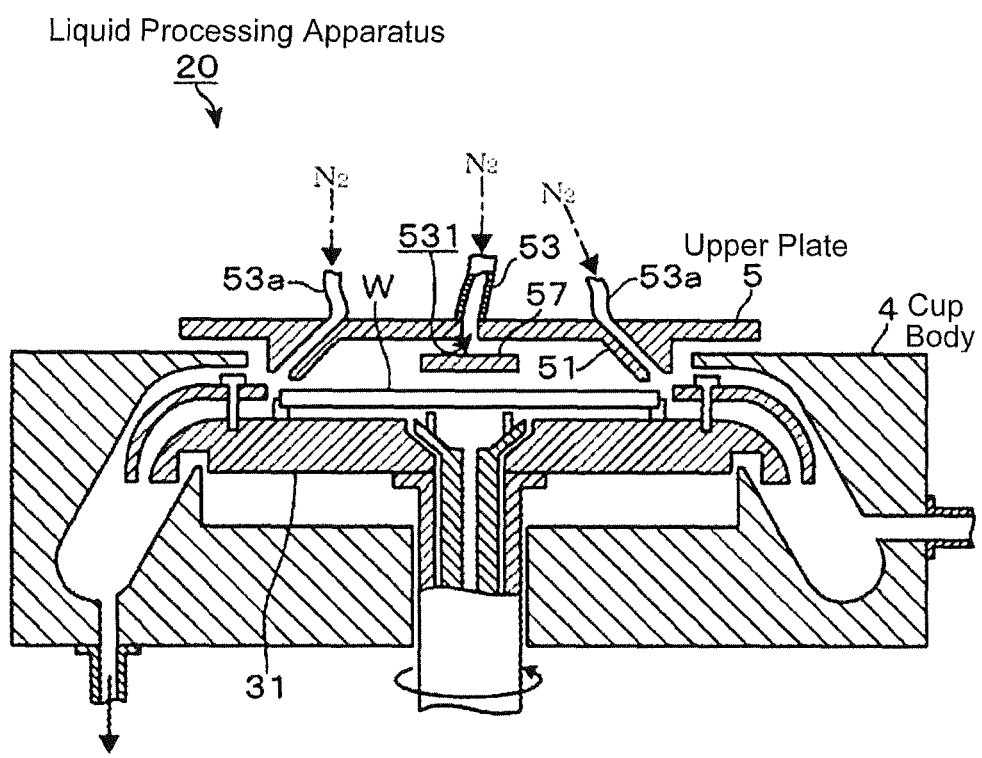
FIG. 9 is an enlarged lateral cross-sectional view illustrating a configuration of a liquid processing apparatus according to a comparative embodiment.

In the present experiment, liquid processing apparatus 2 having upper plate 5 provided with gas inlet port 52, as shown in FIG. 3, and liquid processing apparatus 20 having upper plate 5 not provided with gas inlet port 52, as shown in FIG. 9, have been used. A SiN film of 1500 Å was formed on each upper and lower surface of wafer W. The SiN film was removed by supplying a HF solution only to the lower surface of wafer W. A HF solution with a concentration of approximately 50 wt % and a temperature of 60° C. was supplied for 30 seconds by 1.0 L/minute. After rinsing and dry spinning, the etching state of the upper surface of wafer W was measured. Case 21, etc., is not shown in liquid processing apparatus 20 as shown in FIG. 9.

Exemplary Embodiment 1

The liquid processing has been conducted using liquid processing apparatus 2 having upper plate 5 provided with gas inlet port 52 as shown in FIG. 3. The amount of a fuzzy gas (nitrogen gas) supplied from fuzzy gas supply tube was set to be 200 L/minute.

Comparative Embodiment 1

The liquid processing has been conducted using liquid processing apparatus 2 having upper plate 5 but not provided with gas inlet port 52 as shown in FIG. 9. In liquid processing apparatus 2 as shown in FIG. 9, fuzzy gas supply tube 53a was provided to supply the fuzzy gas from a protruding portion 51 toward a peripheral edge of wafer W as well. The fuzzy gas was supplied by 200 L/minute from fuzzy gas supply port 531 at a central portion, and by 100 L/minute from protruding portion 51 at a peripheral edge. The reference numeral 57 in FIG. 9 depicts a buffer plate which is configured to prevent wafer W from rising up due to the Bernoulli effect caused by the introduction of a large amount of the fuzzy gas onto the surface of wafer W.

Comparative Embodiment 2

In liquid processing apparatus 20 as shown in FIG. 9, a fuzzy gas was supplied only from fuzzy gas supply port 531 at a central portion. Buffer plate 57 was not provided.

B. Experimental Results

Figure 10:
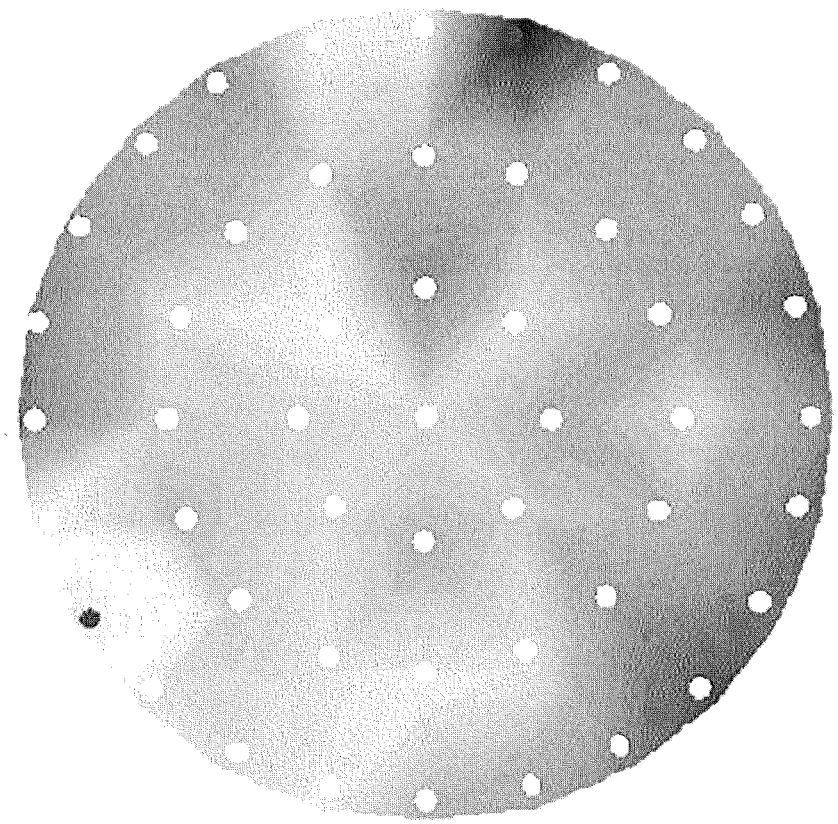
FIG. 10 is an explanatory view illustrating an amount of etching on the upper surface of the wafer according to an exemplary embodiment of the present disclosure.
Figure 11:
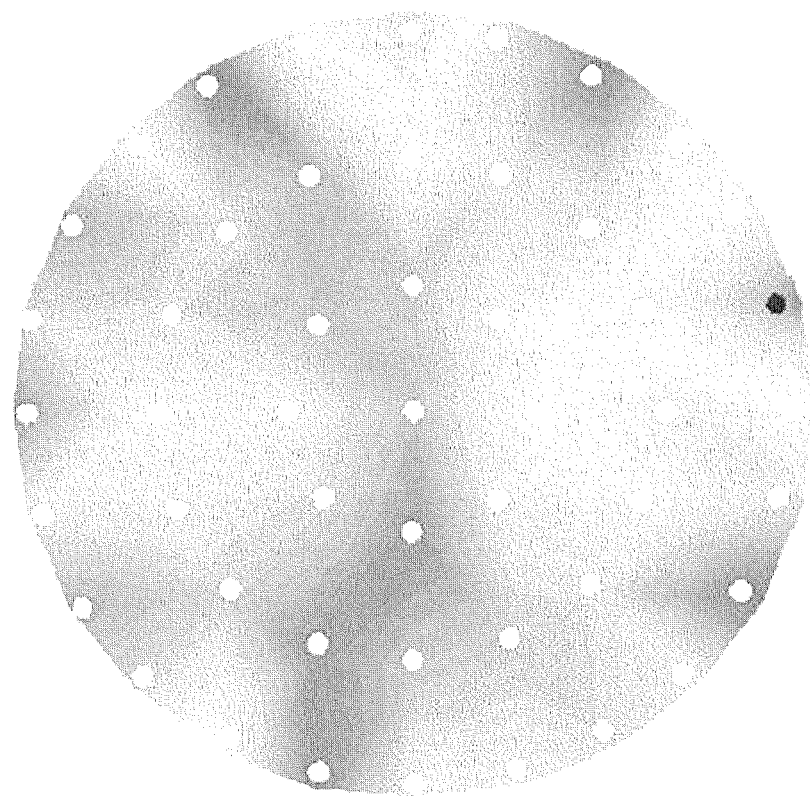
FIG. 11 is a first explanatory view illustrating an amount of etching on the upper surface of the wafer according to the comparative embodiment.
Figure 12:
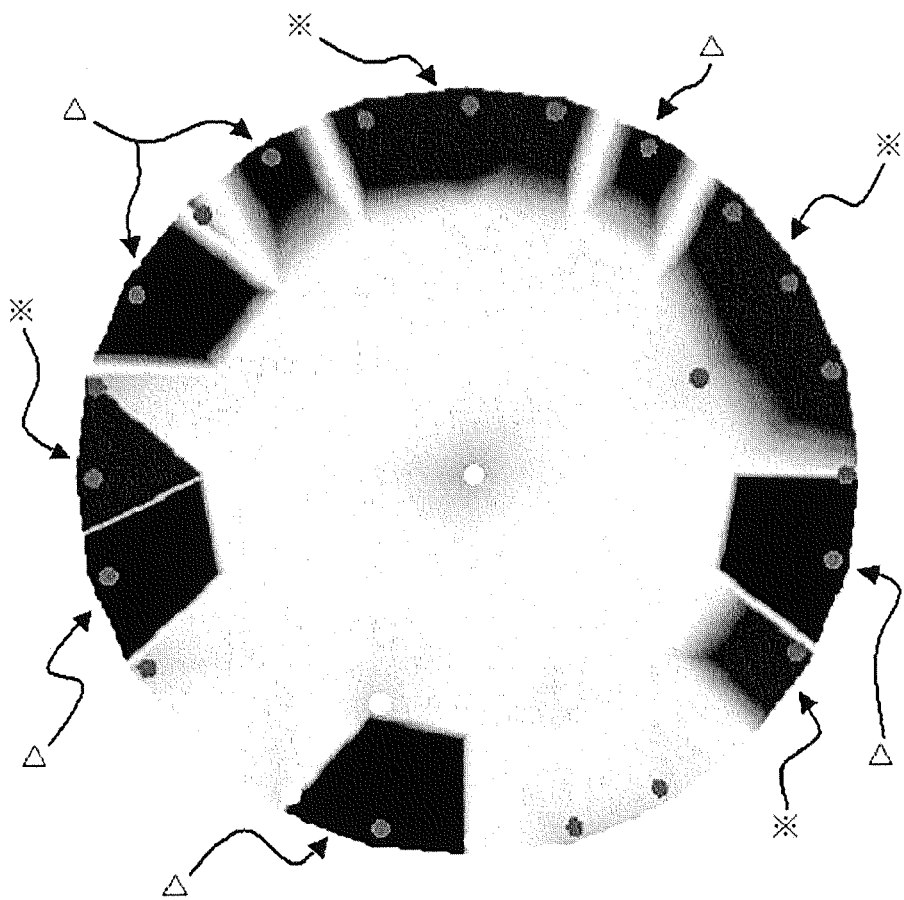
FIG. 12 is a second explanatory view illustrating an amount of etching on the upper surface of the wafer according to the comparative embodiment.

The result of Exemplary Embodiment 1 is shown in FIG. 10, and the results of Comparative Embodiments 1 and 2 are shown in FIG. 11 and FIG. 12, respectively. FIG. 10 to FIG. 12 show results of measurement of the SiN film thickness change measured on an upper surface of wafer W by plotting on wafer W. In these drawings, the results are shown with different colors after contrasting the amount of film thickness change measured on the upper surface of wafer W to the amount change in the range of ±0.4 Å from the average film thickness. Although the black and white drawings do not show clearly, in the actual color plotting, the color of a plot varies blue→green→red as the amount of the film thickness change increase −0.4 Å→average film thickness→+0.4 Å. Each of FIG. 10 and FIG. 12 shows the output of the colored plots converted into a gray scale.

According to FIG. 10 that shows the results of Exemplary Embodiment 1, the etching amount of a SiN film on the upper surface of wafer W falls within the range of approximately ±0.2 Å from the average film thickness, and thus the surface of wafer W was shown almost with green colored plots. It means that, since HF gas does not flow into the upper surface side of wafer W, an etching process was not progressed on the upper surface of wafer W, and thus no remarkable irregularity is formed on the surface of the SiN film.

According to FIG. 11 that shows the results of Comparative Embodiment 1, by supplying the fuzzy gas at a total of 300 L/minute, it is possible to suppress the etching amount of SiN film on the upper surface of wafer W as substantially similar to the results of Exemplary Embodiment 1, and to obtain almost green colored plots throughout the surface of wafer W. However, Comparative Embodiment 1 required the fuzzy gas 1.5 times more than that of Exemplary Embodiment 1. Thus, it is understood that a large quantity of fuzzy gas is required to prevent HF gas from flowing into the upper surface of wafer W in the case of using upper plate 5 not provided with gas inlet tube 52.

According to FIG. 12 that shows the results of Comparative Embodiment 2, the corresponding red zones are depicted by the mark ·✕· indicting the film thickness change of +4 Å or more, and the corresponding blue zones are depicted by the mark ∆ indicating the film thickness change of −4 Å or less, as compared to the average film thickness. The two zones are alternately formed on the circumferential periphery of wafer F. This means that HF gas is introduced onto the upper surface of wafer W so as to progress etching of the SiN film, whereby remarkable irregularities are generated on the upper surface of wafer W. Thus, it is understood that, in the case of using upper plate 5 not provided with gas inlet port 52, HF gas can not be prevented from flowing onto the upper surface of wafer W by only supplying the same amount of the fuzzy gas as in Exemplary Embodiment 1.

From the experimental results of Exemplary Embodiment 1, Comparative Embodiments 1 and 2 mentioned above, it is clear that, by providing gas inlet port 52 on upper plate 5, flowing of HF gas from the lower surface side onto the upper surface side of wafer W can be suppressed, thereby preventing a progress of an unnecessary etching on the upper surface side of wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a substrate holder configured to rotate a substrate while the substrate is maintained horizontally;
   a processing liquid supplier configured to supply a processing liquid to a lower surface of the substrate while the substrate is in rotation;
   a surrounding member configured to receive the processing liquid dispersed from the substrate, the surrounding member surrounds the substrate held on the substrate holder and includes an absorbing discharge port;
   a processing case configured to accommodate the substrate holder, the processing liquid supplier and the surrounding member;
   a gas flow introducing part configured to introduce a gas flow into the processing case; and
   an upper plate configured to oppose an upper surface of the substrate held on the substrate holder,
   wherein the upper plate includes:
      an inert gas supplier positioned at an opposite side of a central portion of the substrate to supply a pressurized inert gas to a space formed between the substrate and the upper plate; and
      a gas supply port configured to introduce the gas flow introduced through the gas flow introducing part from an upper portion of the upper plate into inside the space by a negative pressure formed at the space between the substrate and the upper plate according to the pressurized inert gas from the inert gas supplier.

2. The liquid processing apparatus according to claim 1, wherein the gas supply port is open toward the upper plate.

3. The liquid processing apparatus according to claim 2, wherein a down flow of the gas flow of a clean air is formed on an upper surface side of the upper plate.

4. The liquid processing apparatus according to claim 1, further comprising a gas supply tube connected to the upper plate, and the gas supply port being open toward the gas supply tube.

5. The liquid processing apparatus according to claim 4, further comprising a space into which clean air is supplied, and the gas supply tube is extended to open the gas supply port toward an inside of the space.

6. The liquid processing apparatus according to claim 1, further comprising a gap forming member provided at the periphery of the upper plate and configured to form a gap between the periphery of the upper plate and the peripheral edge of the upper surface of the substrate, the gap being narrower than the space at the central portion side.

7. The liquid processing apparatus according to claim 1, wherein the substrate holder includes a guide plate which is positioned at an opposite side of the lower surface of the substrate and is configured to spread the processing liquid supplied from the processing liquid supplier throughout the lower surface of the substrate.

8. The liquid processing apparatus according to claim 6, wherein the inside of the surrounding member is maintained at a negative pressure with respect to an atmosphere of the upper surface side of the upper plate by an absorption discharge from the absorbing discharge port, and a gap is formed between the surrounding member and the gap forming member to introduce the gas flow of a clean air of the upper surface side of the upper plate into the surrounding member side.

9. The liquid processing apparatus according to claim 1, wherein the processing liquid is HF solution to remove a film formed on the lower surface of the substrate.

10. The liquid processing apparatus according to claim 1, wherein the gas supply port is provided adjacent to the gas supplier positioned at the opposite side of the central portion of the substrate.

11. The liquid processing apparatus according to claim 4, wherein the gas supply tube is directed toward the gas flow introducing part in a chimney shape.

12. The liquid processing apparatus according to claim 5, wherein an upper portion of the case where the case is connected to the gas flow introducing part is provided with a sleeve portion of a short tube shape of which a bottom portion opens toward an inside of the processing case.

13. The liquid processing apparatus according to claim 6, wherein the gas supply port is provided closer to a central portion than the gap forming member.

* * * * *